US007158057B1

(12) United States Patent
Zaidi

(10) Patent No.: US 7,158,057 B1
(45) Date of Patent: Jan. 2, 2007

(54) CIRCUITRY AND METHODS FOR HIGH SPEED DATA ENCODING

(75) Inventor: Iqbal Hussain Zaidi, Poughkeepsie, NY (US)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/221,071

(22) Filed: Sep. 7, 2005

(51) Int. Cl.
  *H03M 5/00* (2006.01)
(52) U.S. Cl. .......................... 341/55; 714/752
(58) Field of Classification Search .............. 341/55, 341/59; 714/752
  See application file for complete search history.

(56) References Cited

U.S. PATENT DOCUMENTS

| | | | |
|---|---|---|---|
| 4,486,739 A * | 12/1984 | Franaszek et al. ............ 341/59 |
| 4,499,454 A | 2/1985 | Shimada |
| 4,626,826 A | 12/1986 | Fukuda et al. |
| 4,855,742 A | 8/1989 | Verboom |
| 5,025,256 A | 6/1991 | Stevens |
| 5,245,339 A | 9/1993 | Cideciyan |
| 5,539,191 A * | 7/1996 | Ackley .................. 235/462.26 |
| 5,699,062 A | 12/1997 | Widmer |
| 5,748,119 A | 5/1998 | Ko |
| 6,192,027 B1 * | 2/2001 | El-Batal ..................... 370/222 |
| 6,295,010 B1 | 9/2001 | Thiesfeld |
| 6,323,789 B1 | 11/2001 | Lawrence |
| 6,333,704 B1 | 12/2001 | Jung et al. |
| 6,501,396 B1 * | 12/2002 | Kryzak et al. ................ 341/59 |
| 6,614,369 B1 * | 9/2003 | Widmer ........................ 341/59 |
| 6,617,984 B1 * | 9/2003 | Kryzak et al. ................ 341/59 |
| 6,642,862 B1 | 11/2003 | Boudry |
| 6,691,275 B1 * | 2/2004 | Jaeckel ....................... 714/752 |
| 6,700,510 B1 * | 3/2004 | Kryzak et al. ................ 341/59 |
| 6,886,126 B1 * | 4/2005 | Grivna et al. ............... 714/752 |
| 6,914,545 B1 * | 7/2005 | Zaidi ........................... 341/59 |

OTHER PUBLICATIONS

"A DC-Balanced, Partitioned-Block, 8B/10B Transmission Code", A.X. Widmer, et al., IBM J. Res. Develop., vol. 27, No. 5, Sep. 1983.

* cited by examiner

*Primary Examiner*—Jean Bruner Jeanglaude
(74) *Attorney, Agent, or Firm*—Rosalio Haro

(57) ABSTRACT

An unpartitioned high-speed 8B/10B encoder and corresponding methods use only one edge or level of the clock signal per clock cycle to encode a set of 8B to a corresponding set of 10B data, and thus is not limited to a 50% clock duty cycle. The encoder includes an unpartitioned encoding circuit that receives 8B data and a special character signal and generates 10B intermediate data, a disparity control that receives the 8B data and the special character sign in parallel with that information being received by the encoding circuit, and also receives a clock signal, and generates two control signals; and logic circuitry that receives the intermediate output data and the two control signals and generates the 10B output data. The encoder may be embodied in a high-speed encoding system in which the processing speed of the encoder is greater than 250 MHz.

6 Claims, 2 Drawing Sheets

CIRCUITRY AND METHODS FOR HIGH SPEED DATA ENCODING

BACKGROUND OF THE INVENTION

1. Field of the Invention

This invention relates generally to methods and structures for improving byte-oriented encoding, and more particularly to methods and structures that provide improvements in high speed encoding.

2. Description of the Related Art

It is well known that 8B/10B encoders employ a partitioned design. That is, such encoders are designed to consolidate a 5B/6B code and 3B/4B code into a compound 8B/10B code, using separate coders for each operation. See, for example, "A DC-Balanced, Partitioned-Block, 8B/10B Transmission Code" by A. X. Widmer and P. A. Franaszek, which describes a typical 8B/10B encoder and provides a discussion on eight-bit to ten-bit encoding logic. This paper is incorporated herein by reference. In such a partitioned encoder, both the positive and the negative edges of the clock are used to encode data. In conventional design, at the positive edges data is encoded from 5B to 6B, and at the negative edges data is encoded from 3B to 4B. However, using both edges of the clock has some disadvantages, as well as technical difficulties.

One disadvantage is that more I/O pins are needed for the circuit chip embodying the encoder as a result of using both clock edges to encode data. Moreover, with this prior art design, a 50% clock duty cycle is needed to complete the encoding of 5B to 6B and 3B to 4B. As a result of this clocking scheme, it is also sometimes difficult to maintain the run length of an encoded binary signal string to five or less. A long run-length, e.g., greater than five destabilizes clock data recovery logic and produces unreliable clock data recovery in a high-speed data communication application, such as a peripheral component interconnect express card. Consequently, such conventional encoders are not well suited for high-speed, i.e., greater than 250 MHz, encoding applications.

SUMMARY OF THE INVENTION

The present invention is designed to overcome these problems by providing an unpartitioned, high-speed encoder that uses only one edge of the clock in each cycle to encode a full input data string and thereby generate the output data string.

In one aspect, the invention involves an encoder that comprises: an unpartitioned encoding circuit configured to receive input data in a first bit width and a special character signal and to generate intermediate output data in a second bit width; a disparity control configured to receive the input data in the first bit width, the special character signal, and a clock signal, and to generate a plurality of control signals; and logic circuitry configured to receive the intermediate output data and the plurality of control signals and to generate output data in the second bit width. In accordance with the invention, only one level or transition of the clock signal per clock cycle is used to encode one full set of input data in the first bit width to one corresponding full set of output data in the second bit width.

Preferably, the unpartitioned encoding circuit and the disparity control receive the input data in the first bit width in parallel.

Preferably, the encoder is configured to operate according to any of a plurality of clock duty cycles.

In another aspect of the invention, a high-speed encoding system comprising the above-described encoder is provided. In such a system, the processing speed of the encoder is preferably greater than 250 MHz.

According to a further aspect, the invention may be realized as a method for encoding data received in a first bit width into data of a second bit width. The method comprises: receiving input data in a first bit width and a special character signal; generating intermediate output data in a second bit width from the received input data in the first bit width and the special character signal; generating a plurality of control signals from the received the input data in the first bit width, the special character signal, and a clock signal; and generating output data in the second bit width from the intermediate output data and the plurality of control signals. Each encoding operation encoding one full set of input data in the first bit width to one corresponding full set of output data in the second bit width is performed using only one level or transition of the clock signal per clock cycle.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For the sake of convenience and simplicity, the terms "in communication with" and the like may refer to direct or indirect relationships between the two or more elements so communicating.

Figure 1:
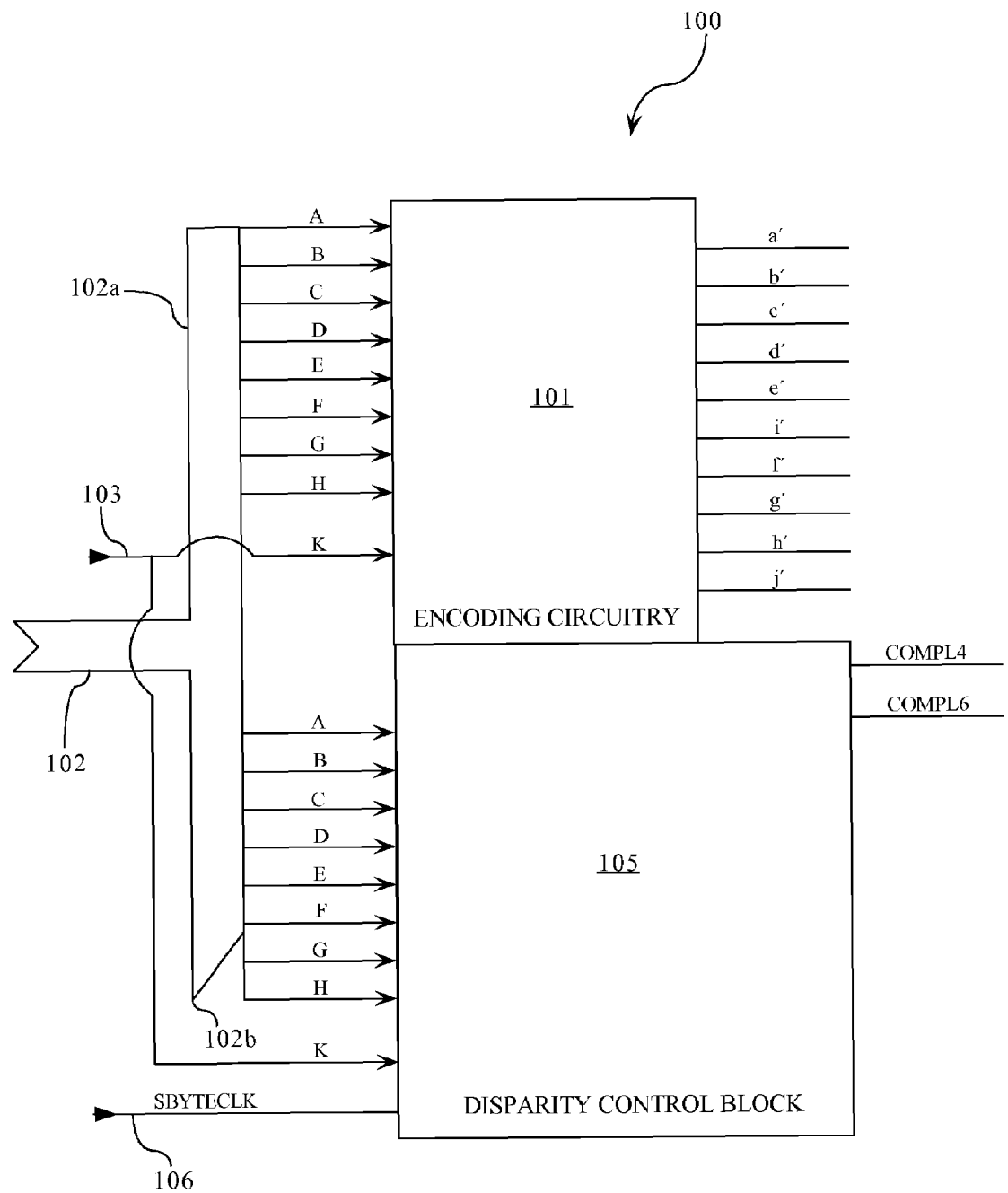
FIG. 1 is a block diagram of encoding circuitry and a disparity control block of an encoder configured according to embodiments of the invention.

Referring now to FIG. 1, a portion of an unpartitioned, high-speed 8B/10B encoder, identified by the reference numeral 100 and designed in accordance with embodiments of the invention, is illustrated. Such an encoder 100 may be part of, or in communication with, a high-speed communications circuit.

Encoder 100 includes encoding circuitry 101 that has a plurality of input terminals configured to receive an input data string from an input line or data bus 102, which may be in communication with a communications adapter from which the input data string was received. A first parallel branch 102a of input line 102 is in communication with the encoding circuitry's input terminals. Input data string comprises a string of bits; in the preferred embodiment, there are eight bits, and they are identified by ABCDEFGH. Encoding circuitry 101 also has an input for receiving a "K" character signal from a control line 103 coupled thereto. The K character signal is as described in the Widmer et al. paper identified above and incorporated by reference herein. Encoding circuitry 101 uses the K character signal to classify the incoming bits of the input data string as data or control information. Following classification, all eight input bits, ABCDEFGH, of the input data string are encoded into ten bits, a'b'c'd'e'i'f'g'h'j', which collectively represent an intermediate output data string. The encoding is done in accordance with the encoding rules of encoding circuitry 101. The encoding rules may be in the form of one or more conversion tables, as is known in the art.

In accordance with the invention, the input data string is not partitioned into sub-strings, either for purposes of classification or encoding, as is done in encoders that employ both 5B/6B and 3B/4B classification and encoding functions.

Encoder 100 also includes a disparity control block 105 that has a plurality of inputs to receive the input data string ABCDEFGH from a second parallel branch 102b of input data line 102, the K character signal from control line 103, and a byte rate clock signal (SBYTECLK) 106. Using the input data string and the K character signal, disparity control block 105 performs disparity control on two sub-strings of data, ABCDE and FGH, and generates two control signals, COMPL4 and COMPL6, which control the complementation of the output data string, as described below. In performing disparity control, disparity control block 105 also limits the run length to five or less, even at high encoding speeds.

It will be noted that disparity control block 105 receives the input data string in unclassified form and the K character signal, instead of 6B bit and 4B bit control signals as is the case in the 8B/10B encoder described in the Widmer et al. paper. However, the disparity control and generation of the control signals in the present invention, although based on somewhat different input signals, follows the same principles as described in the Widmer et al. paper. That is, the disparity of a block of data is the difference between the number of ones and zeros in the block; positive disparity indicates an excess of ones, while negative disparity indicates an excess of zeros. Moreover, the COMPL4 and COMPL6 generated in the present invention are indicative of the same conditions as in the design described in the Widmer et al. paper.

However, the disparity control block 105 of the present invention advantageously receives the input data string in parallel with encoding circuitry 101. Thus, the operations of encoding circuitry 101 are done in parallel with the operations of disparity control block 105. The parallel processing of the present invention supports a higher encoding speed.

Figure 2:
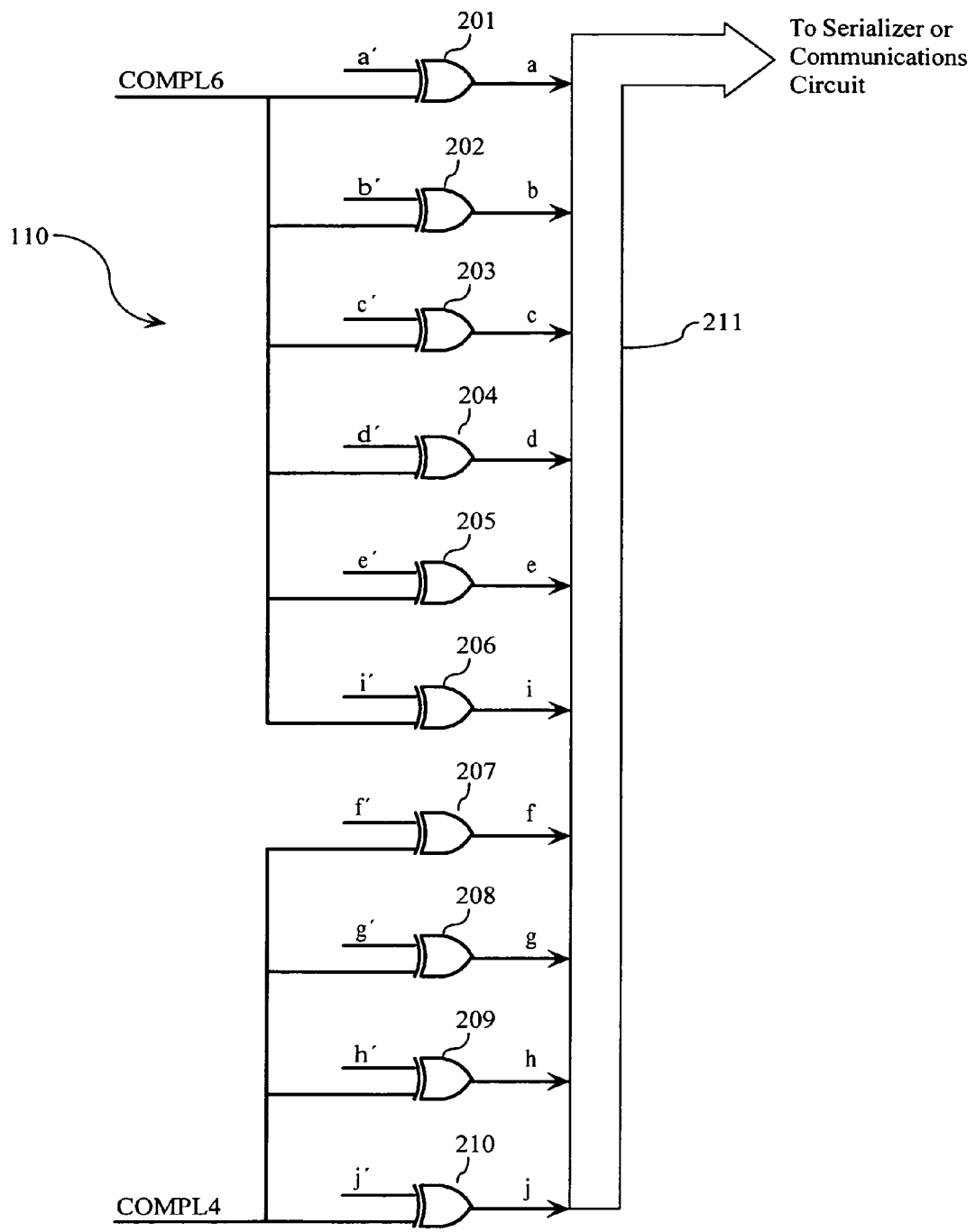
FIG. 2 is a schematic of logic circuitry of the encoder.

Referring now to FIG. 2, encoder 100 further comprises logic circuitry 110, which comprise N two-input exclusive OR (XOR) gates, where N is the number of bits in the intermediate output string output from encoding circuitry 101. In the illustrated and preferred embodiment, N=10.

Logic circuitry 110 receives as inputs the bits of the intermediate output data string and the COMPL4 and COMPL6 signals. Specifically, one input of XOR gates 201, 202, 203, 204, 205, 206, 207, 208, 209, and 210 receive bits a'b'c'd'e'i'f'g'h'j' respectively. COMPL6 is applied to the other input of XOR gates 201, 202, 203, 204, 205, and 206 to control the complementation of each of six of the output bits, abcdei, of the output data string abcdeifghj, based on the disparity control performed on bits ABCDE by disparity control block 105. COMPL4, on the other hand, is applied to the other input of XOR gates 207, 208, 209, and 210 to control the complementation of each of four of the output bits, fghi, of the output data string, based in part on the disparity control performed on bits FGH by disparity control block 105.

The output of each of the XOR gates 201–210 is provided to a serializer or other communications circuit through an output data line or bus 211.

A plurality of XOR gates is but one arrangement of the logic circuitry, albeit the preferred one, for generating the output data string from intermediate output data string and the two control signals COMPL4 and COMPL6. As one skilled in the art will readily understand, other arrangements of logic gates may be used instead to achieve the functionality of logic circuitry 110, as explained above.

Encoder 100 advantageously uses only one edge of the clock 106 in each cycle to encode an input data string to a corresponding output data string. Doing so enables encoder 100 to operate at a faster clock speed and at a variety of clock duty cycles. The encoder of the present invention is not limited to a 50% clock duty cycle. Using one cycle per encoding operation enables encoder 100 to operate according to other duty cycles, thereby making clock multiplier design easier. Such a clocking and encoding scheme also makes encoder 100 better suited for high-speed encoding, i.e., encoding at speeds greater than 250 MHz. Also, using only one edge of the clock to encode data, as encoder 100 does, reduces the number of I/O pins that are needed for a circuit chip embodying the encoder, as compared with the number of I/O pins that are needed for a circuit chip for a prior art partitioned encoder.

Although preferred embodiments of the present invention apply to 8B/10B encoding, the encoding can be between other bitwidths (e.g., XB/YB), where X and Y are greater than 8 and 10 respectively, so long as appropriate modifications are made to the circuitry for handling more bits. Further, specific mention is made with regard to "high speed," but the speed of the circuitry should not restrict the invention or applicability to other circuit and semiconductor design implementations.

While the invention has been described in conjunction with specific embodiments, it will be evident to those skilled in the art that many further alternatives, modifications, applications and variations will be apparent in light of the foregoing description. Thus, the invention described herein is intended to embrace all such alternatives, modifications, applications and variations as may fall within the spirit and scope of the appended claims.

What is claimed is:

1. An encoder, comprising:
   an unpartitioned encoding circuit configured to receive input data in a first bit width and a special character signal and to generate intermediate output data in a second bit width;
   a disparity control configured to receive the input data in the first bit width, the special character signal, and a clock signal, and to generate a plurality of control signals; and logic circuitry configured to receive the intermediate output data and the plurality of control signals and to generate output data in the second bit width;

wherein only one level or transition of the clock signal per clock cycle is used to encode one full set of input data in the first bit width to one corresponding full set of output data in the second bit width.

2. The encoder of claim 1, wherein the unpartitioned encoding circuit and the disparity control receive the input data in the first bit width in parallel.

3. The encoder of claim 1, wherein the encoder is configured to operate according to any of a plurality of clock duty cycles.

4. A high-speed encoding system comprising the encoder of claim 1.

5. The high-speed encoding system of claim 4, wherein the processing speed of the encoder is greater than 250 MHz.

6. A method for encoding data received in a first bit width into data of a second bit width, comprising:

receiving input data in a first bit width and a special character signal;

generating intermediate output data in a second bit width from the received input data in the first bit width and the special character signal;

generating a plurality of control signals from the received input data in the first bit width, the special character signal, and a clock signal; and generating output data in the second bit width from the intermediate output data and the plurality of control signals;

wherein each encoding operation encoding one full set of input data in the first bit width to one corresponding full set of output data in the second bit width is performed using only one level or transition of the clock signal per clock cycle.

* * * * *